United States Patent [19]

Cook et al.

[11] Patent Number: 4,912,532
[45] Date of Patent: Mar. 27, 1990

[54] ELECTRO-OPTICAL DEVICE WITH INVERTED TRANSPARENT SUBSTRATE AND METHOD FOR MAKING SAME

[75] Inventors: Louis W. Cook, Santa Clara; Michael D. Camras, Sunnyvale, both of Calif.

[73] Assignee: Hewlett-Packard Company, Palo Alto, Calif.

[21] Appl. No.: 237,797

[22] Filed: Aug. 26, 1988

[51] Int. Cl.[4] .................................... H01L 29/161
[52] U.S. Cl. ........................ 357/16; 357/30; 357/17; 357/63; 357/52; 357/64
[58] Field of Search ............... 357/17, 30 B, 30 E, 357/63, 64, 16, 52

[56] References Cited

U.S. PATENT DOCUMENTS

| | | | |
|---|---|---|---|
| 4,707,716 | 11/1987 | Daniele | 357/17 |
| 4,719,497 | 1/1988 | Tsai | 357/17 |

OTHER PUBLICATIONS

"Liquid Phase Epitaxial Growth of Six—Layer GaAs/(GaAl) As Structures for Injection Lasers with 0.04 μm Thick Centre Layer", *Journal of Crystal Growth* 27, (1974), G. H. B. Thompson & P. A. Kirkby, pp. 70–85.

"High Efficient GaAlAs Light-Emitting Diodes of 660 mn with a Double Heterostructure of an GaAlAs Substrate", *Appl. Phys. Lett.* 43 (11), Dec. 1, 1983, H. Ishiguro et al., pp. 1034–1036.

Ishiguro et al., *Applied Physics Letters*, vol. 43, No. 11, pp. 1034–1036, Dec. 1, 1983.
Thompson et al., *Journal of Crystal Growth* 27 (1974), pp. 70–85.

*Primary Examiner*—Martin H. Edlow
*Attorney, Agent, or Firm*—Patrick J. Barrett

[57] ABSTRACT

An electro-optical device with a transparent substrate is produced by epitaxially first growing the device layers, followed by that of the transparent substrate layer on an opaque wafer. The opaque wafer is subsequently removed. The device layers have dopants with sufficient low diffusivities that their electronic characteristics are not adversely affected by long exposure to elevated temperature during the growth of the transparent substrate layer. In a liquid phase epitaxy (LPE) method, a repeated temperature cycle technique is used where the temperature is repeatedly raised up each time after cooling to provide a large cooling range for growing a sufficiently thick substrate layer or a series of device layers. In between growths and during the temperature heat-up periods, the device is stored within the LPE reactor. In other embodimens, the device is either temporarily removed from the LPE reactor or is transferred to another reactor. When a epitaxial layer is oxidizable, a non-oxidizable cap is temporarily grown on it in between growths and during the temperature heat-up periods. The cap is subsequently removed by melting back at an elevated temperature just prior to the growth of a next layer.

11 Claims, 3 Drawing Sheets

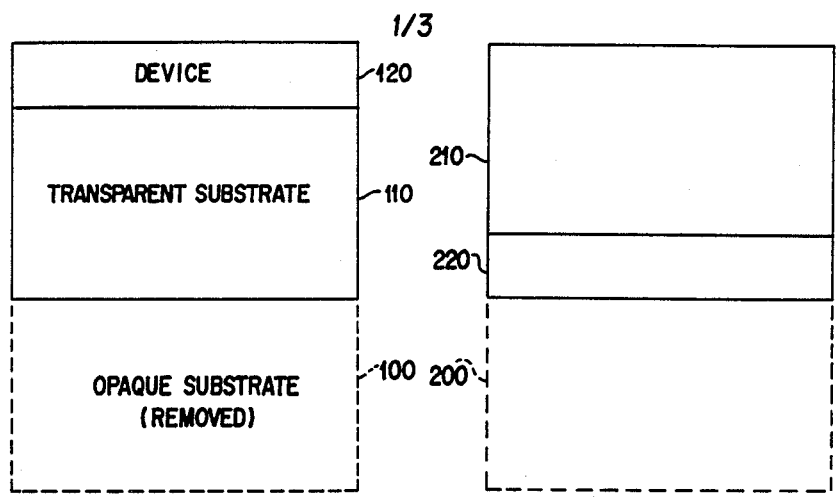
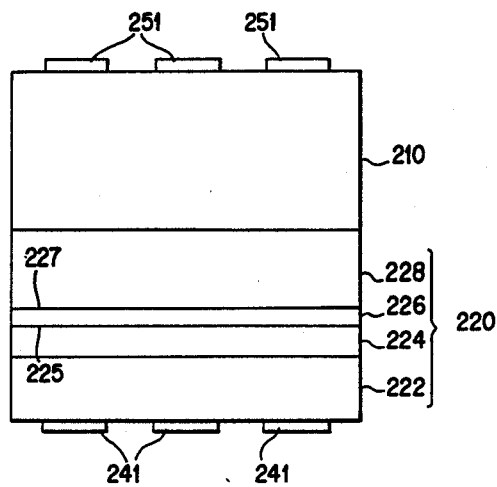
FIG.1 PRIOR ART
FIG.2
FIG.5

ELECTRO-OPTICAL DEVICE WITH INVERTED TRANSPARENT SUBSTRATE AND METHOD FOR MAKING SAME

BACKGROUND OF THE INVENTION

This invention relates in general to electrooptical devices and in particular to an electro-optical device with an inverted transparent substrate.

Light emitting diodes (LED's) are frequently used for displays and indicators as well as fiberoptic sources. In one type of LED's, a p-n junction semiconductor is employed. A potential difference is applied across the junction by means of a pair of electrode contacts in contact with the p-type and n-type regions. This causes electrons to be injected across the junction from the n-type region to the p-type region and causes holes to be injected across the junction from the p-type region to the n-type region. In the p-type region, the injected electrons recombine with the holes resulting in light emission; in the n-type region, the injected holes recombine with electrons resulting in light emission. The wavelength of the light emission depends on the energy generated by the recombination of electrons and holes; which is determined by the band gap of the p-n junction semiconductor material.

To enhance the efficiency of light emission, it is known to those skilled in the art to be preferable to cause only one of the two types of carriers, namely electrons or holes, to be injected across the junction, but not both. In improved LED's, a p-n single heterojunction semiconductor is employed. A heterojunction is the interface between two different types of materials; thus a heterojunction is formed at the junction between a p-type and an n-type semiconductor material. In a single heterojunction device, the energy band gap in the p-type region is different from that in the n-type region so that either electrons or holes, but not both, are injected across the junction. The injected electrons or holes then recombine to cause light emission. For example, if the materials of the n-type and p-type regions are selected with the n-type region having a wider band gap than the p-type region, this has the effect of causing the electrons injected from the n-type region to the p-type region to have a lower potential barrier than the holes injected in the opposite direction. Thus, essentially only electrons will be injected across the junction, and the p-type layer where radative recombination takes place is referred to below as the p-active layer.

A device known as a double heterojunction LED further improves on the efficiency of single heterojunction LED's by the addition of another p-type layer of higher band gap material between the p-active layer and the substrate. A second heterojunction is thus effected between the p-active layer and the additional p-type layer. The higher band gap of the additional p-type layer helps to confine the injected electrons within the smaller band gap p-active layer. This allows for a much thinner p-active layer which minimizes re-absorption and increases light emission efficiency. Also the extra p-type layer provides another window for light out of the p-active layer.

The p- or n-type layers of various band-gaps are typically grown as epitaxial layers from the alloys of III–V compounds. For example, an efficient red LED can be fabricated from aluminum gallium arsenide (AlGaAs) semiconductor material. The energy band gap of the semiconductor material can be increased with substitution of aluminum atoms for gallium atoms. The greater the aluminum substitution in the resulting material, the higher is the band gap. The varying concentration of aluminum does not affect the lattice constant, and this property allows successive epitaxial layers of lattice-matched AlGaAs to be grown easily. Typically, to minimize re-absorption, the band-gaps of all layers are chosen to be wider than that of the active layer. In this way, these layers appear transparent to the red light emitted from the active layer. By the same consideration, the substrate on which the epitaxial layers are grown should ideally have a wider band-gap. However, it is not possible to obtain AlGaAs in wafer form, and instead, the lattice-matched GaAs is commonly used as a substrate.

Gallium arsenide (GaAs) has a band-gap of 1.43 electron volts (ev) which corresponds to the infrared end of the light spectrum. It is therefore highly absorptive of, and opaque to, visible light. LED devices formed on GaAs substrates thus are inherently disadvantageous in that the emitted light in the solid angle sustained by the opaque substrate, as well as light reflected by critical angle reflection at the upper surface, is lost to absorption. This amounts to more than 80% of the total light output.

It is possible to have transparent substrate LED's, an example of which is disclosed by Ishiguro et al in Applied Physics Letters, Vol. 43, No. 11, pages 1034–1036, Dec. 1, 1983. Ishiguro et al report as AlGaAs red LED with an efficiency of 8%. The LED reported has the advantage of a transparent substrate but is much more difficult and costly to make. The process involves growing various transparent layers of AlGaAs on an absorbing GaAs substrate. The first transparent layer adjacent to the GaAs substrate serves as a substitute substrate and subsequent layers constitute the device. The opaque GaAs substrate is subsequently removed, leaving the device on the substitute transparent substrate only.

A transparent substate LED device normally includes a transparent substrate and device layers whose electrical and optical properties are critical for the performance of the device. To provide support for the device, the substitute transparent substrate must be grown sufficiently thick while maintaining a sufficiently good surface for the epitaxial growth of the device layers. This is costly and time consuming for two reasons. First, for the substrate to be transparent, an AlGaAs composition with a high concentration of aluminum must be used. The surface of epitaxial growth from such constituency is prone to oxygen absorption, in which event further growth is either degraded or impeded. Secondly, imperfections will compound in growing a thick layer of AlGaAs, even under the best of conditions. This provides a much less than ideal substrate. Subsequent epitaxial growth of the fairly thin, critical device layers on a rough substrate will inevitably result in large sample to sample variations, if not high failure rates.

SUMMARY OF THE INVENTION

As explained above, in existing processes for growing transparent substrate light emitting diodes, the thick transparent substrate layer is grown first, followed by the growing of the thin critical device layers on top of the transparent substrate layer. As noted above, the top surface of the transparent substrate layer provides a less than ideal surface for growing the critical device layers. This invention is based on the observation that the quality of the device layers can be much improved by reversing the conventional process. Thus, instead of growing the thick transparent substrate layer first on top of the opaque GaAs substrate followed by the growing of the device layers, the device layers are grown first, followed by the thick transparent substrate layer.

The device grown by the above-described process of this invention is advantageous since the layers that are critical for the light emitting properties of the device are grown first, followed by the growth of the transparent substrate layer. This assures that the critical device layers are formed on a good quality surface. The transparent substrate grown later on is simply used as a handle, the electrical and optical properties of which are not as critical as those of the device layers. Therefore, the fact that the transparent substrate layer is grown on top of the device layers does not noticeably degrade the performance of the device.

The process of this invention is not limited to applications in producing light emitting devices. It is useful generally for growing devices for converting electrical current to light or light to electrical current. The critical device layers which serve to convert electrical current to light or light to electrical current are referred to collectively below as a section. The invention is directed to an electro-optical device which includes a transparent substrate supporting a section with doped semiconductor material. The section serves to convert electrical current to light or light to electrical current. In contrast to conventional transparent substrate devices, the order of forming the transparent substrate layer and the section is reversed. First, the section is epitaxially formed on an opaque substrate; then a transparent substrate is formed on the section itself. Thereafter, the opaque substrate is removed leaving an electro-optical device on a transparent substrate. This enables the section to be formed on a good surface, thereby ensuring consistently good crystalline quality, independent of any of the problems related to the growth of the transparent substrate.

In the preferred embodiment, the opaque substrate is composed of a group III-V or group II-VI semiconductor material on which the device layers may be grown. Preferably, the opaque substrate has a low dislocation density of less than $10^5$/sq.cm.

The growing of the thick transparent substrate layer requires a long period of time on the order of a day. Since the process of this invention calls for growing the transparent substrate after the section is grown, the section is therefore exposed to elevated temperatures for a long time period while the thick transparent substrate is being formed. The most commonly used dopant of p-type devices is zinc. If zinc is used for doping the semiconductor material in the section, exposure to elevated temperatures for a long time period would cause unacceptable diffusion of the dopant. Therefore, in this invention, the dopants of the semiconductor material are chosen so that they have a diffusivity low enough so that the electronic characteristics of the material in the section are not adversely affected when heated to elevated temperatures for a long time period. The dopants are chosen to have a diffusivity smaller than that of zinc.

The invention is also directed to a method of making a transparent substrate electro-optical device. The device has a section which serves to convert electrical current to light or light to electrical current. The section is first grown epitaxially onto an opaque substrate followed by the growth of a transparent substrate onto the section. The opaque substrate is subsequently removed.

In particular, the invention is directed to a method of making an electro-optical device which includes the steps of successively forming sufficiently thick epitaxial layers. One or more melts designated for the epitaxial growth of the various layers are raised to a predetermined temperature in an oven. The substrate is placed in contact with one of the melts at a time, while the melt is allowed to cool and deposit an epitaxial layer on the substrate. Then the substrate is isolated from the melt while the oven temperature is restored to a high temperature. In the meantime, the substrate may either be stored inside the oven or temporarily removed from it or be transferred to another oven for growing subsequent layers. In any case, thereafter, the wafer is placed in contact with the next designated melt to grow the next layer. Where the grown layer includes an oxidizable component, an additional, temporary, protective epitaxial layer resistent to oxidation is formed following the original growth. This protective layer is removed by melting back into the melt for the next layer by elevating the temperature prior to subsequent cooling for growing the next layer.

Additional objects, features and advantages of the present invention will become apparent from the following description of a preferred embodiment thereof, which description should be taken in conjunction with the accompanying drawings.

BRIEF DESCRIPTION OF THE DRAWINGS

FIG. 1 shows a cross-sectional schematic view of a conventional, transparent, substrate, electro-optical device;

FIG. 2 shows a cross-sectional schematic view of an inverted, transparent substrate, electro-optical device according to the present invention;

FIG. 5 illustrates an example of the electro-optical device as a double heterojunction light emitting diode;

DETAILED DESCRIPTION OF THE PREFERRED EMBODIMENT

Figure 3A:
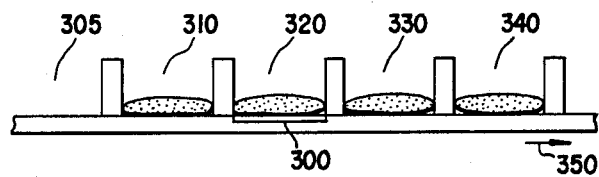
FIG. 3A illustrates a slider boat arrangement in a liquid phase epitaxy reactor for growing multi-layer structures in a conventional single temperature cycle scheme.

FIG. 1 illustrates a cross-sectional schematic view of a conventional, transparent substrate, electro-optical device. For example, a low dislocation gallium arsenide (GaAs) substrate is used as a substrate 100. A thick layer of aluminum gallium arsenide (AlGaAs) layer 110, serving as a substitute transparent substrate, is first formed on top of the original substrate 100. Subsequent layes of AlGaAs which constitute an electro-optical section of the device 120 are successively formed on top of the AlGaAs substrate 110. The original opaque GaAs substrate 100 is then removed to leave behind an opto-electronic device 120 on a transparent AlGaAs substrate 110.

The transparent substrate 100 has a thickness on the order of one or two hundred microns. When layers of such thicknesses are grown, imperfections will compound, even under the best of growing conditions. Therefore the top surface of substrate 110 will provide a much less than desirable surface for growing device 120, so that device 120 will also include many imperfections. Such imperfections degrade the performance of the electro-optical device.

FIG. 2 illustrates a cross-sectional schematic view of an inverted, transparent substrate, electro-optical device according to the present invention. A device section 220 comprising a plurality of semiconducting layers is first formed on top of a low dislocation substrate 200 by techniques such as liquid phase epitaxial (LPE) growth. Thereafter another layer 210 of semiconducting material, of sufficient thickness to act as a substitute transparent substrate, is formed on top of the device 220 by techniques such as LPE growth. If the substrate 210 is grown by the LPE process, its aluminum content will decrease in the growth direction. The ultimate performance of the device is critically depend-ent on how well formed the device section 220 is, and the original low dislocation substrate 200 provides a near ideal basis for its epitaxial growth. The substrate 200 is usually opaque but can subsequently be removed by chemical etching, leaving behind a well-formed device section 220 on a transparent surface 210.

In the preferred embodiment, the opaque substrate 200 is composed of a group III–V or group II–VI semiconductor material on which the device layers may be grown. Preferably, the opaque substrate has a low dislocation density of less than $10^5$/sq.cm.

While in the preferred embodiment, a LPE process is used, it is to be understood that the invention is equally applicable to other processes, such as vapor phase epitaxy (VPE), metal-organic chemical vapor deposition (MOCVD) and molecular beam epitaxy (MBE); such variations are within the scope of the invention. The electro-optical device made according to the present invention has the advantage that the critical device is formed on a good surface thereby ensuring consistently good crystalline quality, independent of any of the problems related to the growth of the transparent substrate.

However, use of the usual p-dopants such as zinc is undesirable with the process of the present invention since their diffusivity in AlGaAs at high temperature is appreciable. This is normally not a serious problem in normal applications where the various layers grown to form the device are relatively thin. Since a thin layer requires less time to form, the total exposure of the device to high temperature is limited (of the order of a few hours). The usual n-dopants such as tellurium, on the other hand, do not present a problem even for prolonged period of time at high temperature since they have low diffusivity and therefore do not migrate appreciably from the doped material.

According to the invention, owing to the sequence of growing the device layers first followed by the growth of a thick substrate layer, the p-n junction of the device is exposed to elevated temperature for prolonged period of time (as long as 20 hours). The use of the conventional zinc dopants would result in the migration of the p-n junction and a degraded or inoperable device. Instead, the present invention employs magnesium as the preferred p-dopant, which exhibits little diffusivity under the present condition. Among other possible candidates are beryllium, carbon, manganese, silicon and germanium. Ordinarily, the high oxygen affinity of magnesium makes it less desirable than zinc for use as a dopant. However, careful elimination of moisture and oxygen in the reactor helps to alleviate the problem. Also the comparative higher concentration of aluminum in AlGaAs effectively competes for what little oxygen remains in the LPE reactor. The doping may be accomplished simply by employing a melt with the desired dopants when the layer to be doped is grown.

It is to be understood that the method described above is generally applicable to situations where a transparent substrate device is fabricated by first forming the critical device layers on a light absorbing substrate. Examples of these devices include photodiodes and solar cells where light must pass through the substrate in reach to, or to emanate from the device. Also, besides AlGaAs mentioned above, other III–V alloy materials such as aluminum indium gallium phosphide (AlInGaP), indium gallium arsenide phosphide (InGaAsP), aluminum indium gallium arsenide phosphide (AlInGaAsP), aluminum indium phosphide (AlInP), and indium gallium phosphide (InGaP) can also form transparent alloys which are lattice-matched to GaAs. Thus, the method is equally applicable to forming transparent substrate devices based on AlInGaP, InGaAsP, AlInGaAsP, AlInP and InGaP on a GaAs substrate.

Another consideration in a transparent substrate device is the need to grow a thick layer of transparent substrate, in addition to the device layers section. Generally, a common technique of growing the various layers of AlGaAs is by the cool-down liquid phase epitaxy growth process.

Figure 3B:
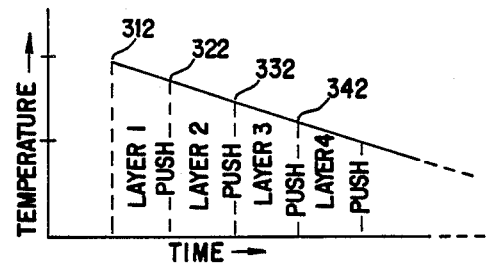
FIG. 3B illustrates the cooling rate of the conventional single temperature cycle scheme of FIG. 3A.

FIGS. 3A–3B illustrate schematically a conventional, single temperature cycle LPE growth process. The original substrate serves as a seed crystal. It sits in a depression in the slider 300 which pushed successively under the melts residing in the various bins 310, 320, 330 and 340 inside the LPE reactor. Thus, in order to grow a first layer of AlGaAs of a required composition, a melt of that composition with a concentration which is saturated at a first temperature 312 (FIG. 3B) is placed in the first bin 310. To grow a second layer, a melt of corresponding composition in a saturated solution at a second temperature 322 is placed in the bin 320. Similarly, for the third, fourth and other layers, the corresponding bins 330, 340 and others have saturated solutions at temperatures 332, 342, and others that follow. Initially, with the substrate in position 305, the LPE reactor is raised to the highest, first temperature 312. Whereupon, the substrate is pushed into the first bin 310 and allowed to cool at a controlled rate. As the temperature drops, the saturated melt depletes out as epitaxial growth on the substrate. When a layer of predetermined thickness has been grown, the temperature drops to the temperature 322, and the substrate is pushed to the next bin to grow the next epitaxial layer. This process is continued through the various bins until all the layers have been grown. Thus, successive layers can be grown by sequentially pushing the seed crystal from under one melt to the next at predetermined temperatures along direction 350 as the reactor temperature is continuously cooled.

The limitation of the conventional single temperature cycle process is that the sum thickness of the whole device is limited by the existing, restricted cooling range. For example, the phase properties of the AlGaAs melt restrict the usable cooling range from a high temperature of 900 degrees centigrade to a low temperature of 600 degrees centrigrade where the melt can no longer hold an appreciable amount of arsenic. This cooling range is normally adequate for growing most device structures on an existing substrate. However, when one or more layers need to be very thick (for example over 100 microns, as in the case of growing a transparent substrate) large cooling intervals are required for each of these layers and a single continuous cooling range is not adequate to grow the whole structure.

The present invention overcomes the thickness limitation by employing a repeated temperature cycle process. In this process, instead of all the growth layers shearing a single cooling range, each individual layer, or a series of layers are afforded the benefit of the full cooling range and hence the corresponding thickness capacity. After a layer, or series of layers have been grown, the temperature of the reactor is raised back to the initial temperature as a starting point for the cool-down growth of the next layer or series of layers. In the interval of heating up, the grown layers must be removed from the melt, otherwise the layers will melt back into the melt as the temperature rises. In one embodiment of the invention, the substrate with the grown layers on it is stored in an empty bin inside the LPE reactor. In another embodiment of the invention, the wafer is removed from the reactor altogether.

However, even in a reactor where water vapor and oxygen have been minimized, some oxidation of the newly grown AlGaAs layer will occur when the reactor is heating up, before the growth of the next layer. The surface oxides formed make nucleation of the next layer very difficult. To overcome this problem, a thin protective cap layer, preferably of GaAs about 0.5 to 5 microns thick, is deposited on the newly formed layer to prevent oxidation.

Figure 4A:
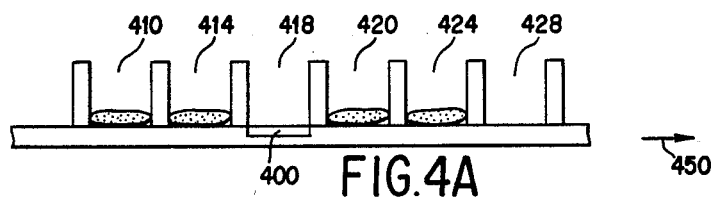
FIG. 4A illustrates the slider boat arrangement in a liquid phase epitaxy reactor for growing multi-layer structures according to the repeated temperature cycles scheme of the present invention.
Figure 4B:
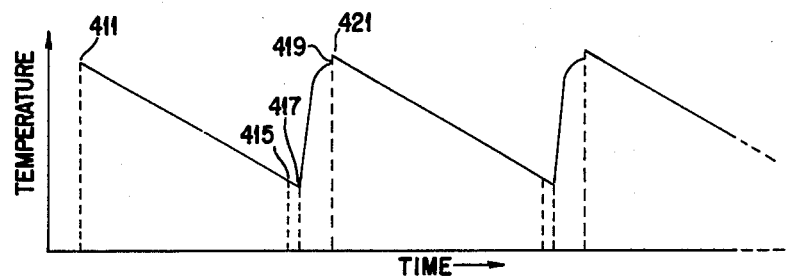
FIG. 4B illustrates the cooling rate of the repeated temperature cycle scheme of FIG. 4A.

Referring to FIG. 4A, a multibin slider boat arrangement according to the preferred embodiment is shown. The original substrate screws as a seed crystal. It sits in a depression in the slider 400 which is pushed successively under the melts residing in the various bins 410, 414, 420 and 424 inside the LPE reactor. The bin configuration in the preferred embodiment is different from that of the single temperature cycle process. In the single temperature cycle case, the melts for successive layers reside in adjacent bins, whereas, in the preferred embodiment, three bins are devoted to the growth of each layer. The first bin contains the melt for growing the epitaxial layer. The second bind contains the melt for growing a thin cap layer of GaAs. The third bin is left empty as a holding cell. Thus, in order to grow a first layer of AlGaAs of a required composition, a melt of that composition with a concentration which is saturated at a first temperature is placed in the first bin 410. Reference is now also made to FIG. 4B which illustrates the cooling cycles. Tracing the temperature versus time curve, the temperature is allowed to cool from a point 411 to a point 415 so as to grow a first layer of required thickness. At the point 415, the substrate 400 is pushed along direction 450 to the bin 414 containing the GaAs. A thin cap layer of GaAs of the order of 0.5 to 5 microns is formed on top of the first layer as the temperature further cools to a point 417. Then the substrate 400 is pushed in the direction 450 to an empty bin 418 which serves as a holding cell. In the meantime, the reactor is heated up back to the first temperature (from the point 417 to a point 419). Thereafter, the substrate is pushed to the next bin 420 containing the melt for growing the second layer. However, prior to repeating the cool-down cycle for the second layer, the temperature of the reactor is raised slighly above the original first temperature, sufficient to melt back the protective GaAs cap into the melt. In this way, the second growth can be effected on a clean surface. The growth cycle may be repeated for any number of layers desired.

In another embodiment of the invention, employing the intermediate protective cap technique, the epitaxial growths are effected by a combination of the single temperature cycle technique (FIGS. 3A, 3B) to grow a series of thin layers and the repeated temperature cycle technique (FIGS. 4A, 4B) to grow one or more thick layers. For example, after growing a series of thin layers by a continuous cool-down run, the wafer may be capped and disposed of as described above. Thereafter, the repeated temperature cycle technique of FIGS. 4A, 4B is employed to grow additional thick layers.

In the case where the epitaxial material does not have a high affinity for moisture or oxygen, the step of adding a protective cap may be omitted.

In another embodiment of the invention, the wafer is removed from the reactor after growing a layer and a thin GaAs cap layer. It is transferred to another reactor, which has been prepared to grow the next layer. Alternatively, it is stored outside until the original reactor is re-configured, and has been prepared to grow the next layer.

In the preferred embodiment, a reactor has been described wherein the substrate is successively slided through a linear multibin arrangement. The invention is equally applicable to a reactor with a rotary multibin arrangement wherein the various bins are successively slided over the substrate. An example of such a reactor is described in *Journal of Crystal Growth* 27 (1974), pp. 70–85.

EXAMPLES

FIG. 5, in combination with FIG. 2, illustrates an example of the electro-optical device as a double heterojunction red LED according to the present invention. Referring first to FIG. 2, a substrate of n-type, low dislocation, single crystal gallium arsenide (GaAs) 200, preferably of thickness greater than 150 microns serves as a substrate. Whether the GaAs substrate is n-type or p-type is not relevant since it is later removed and serves no electrical function.

The details of the LED device are shown in FIG. 5. The various layers are epitaxially grown by the method of the invention described above. A first p-type AlGaAs layer 222, having a thickness preferably in the range of 10 to 30 microns, is formed over the GaAs substrate 200. The first layer 222 has a composition of $Al_xGa_{1-x}As$ where x is preferably in the range of 0.40 to 0.90. The lower Al composition is optimized for growing a thicker layer by the cool-down epitaxial growth methods. A thicker layer ensures better structural reliability and increases the current spreading between the surface contacts and the active layer.

A second p-type AlGaAs layer 224, having a thickness preferably in the range of 2 to 20 microns, is formed over the first p-type layer 222. The second layer 224 has a composition of $Al_xGa_{1-x}As$ where x is preferably in the range of 0.60 to 0.90. This insures good confinement and is optimized for light output performance.

A third thin p-active layer of AlGaAs 226 is formed over the second AlGaAs layer 224. This is the layer where light is generated. The p-active layer 226 preferably has a thickness in the range of 0.05 to 5 microns and a composition of $Al_xGa_{1-x}As$ where x is preferably in the range of 0.35 to 0.45. A first heterojunction 225 is thereby effected by the third p-active layer 226 and the second p-type AlGaAs layer 224.

A fourth layer 228 of n-type aluminum gallium arsenide (AlGaAs), is formed on the third p-active layer 226. The fourth layer 228 preferably has a thickness in the range of 5 to 20 microns, and a composition of $Al_xGa_{1-x}As$ where x is preferably in the range of 0.6 to 0.9. A second heterojunction 227 is thereby effected by the fourth n-type AlGaAs layer 228 and the third p-active layer 226.

A fifth layer 210 of n-type AlGaAs is formed on the fourth n-type AlGaAs layer 228. This layer serves as a substitute transparent substrate after the absorbing GaAs substrate 200 is subsequently removed. The fifth layer 210 preferably has a thickness in the range of 75 to 200 microns and a composition of $Al_xGa_{1-x}As$ where x is preferably in the range of 0.5 to 0.9. The consideration is to grow a thick transparent layer. A composition of AlGaAs with minimum content of Al necessary for producing a transparent substrate is used so as to facilitate growing a thick layer.

The first four layers comprise the device section and have a combined thickness of between 20 to 70 microns. They can be conveniently grown in one single-temperature cycle.

Figure 6A:
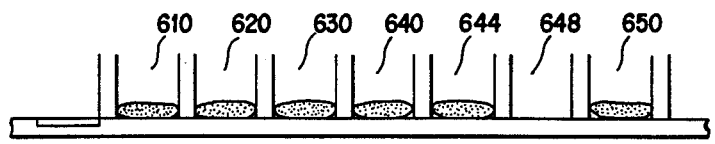
FIG. 6A illustrates the slider boat arrangement for growing multi-layer structures of the device illustrated in FIG. 5.
Figure 6B:
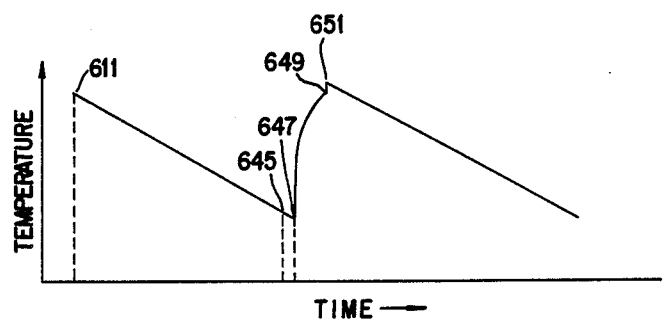
FIG. 6B illustrates the cooling rate of the scheme of FIG. 6A.

FIG. 6A illustrates a multi-bin slider boat arrangement for growing the device. Thus, in the LPE reactor, the first four bins 610, 620, 630 and 640 contain respectively the melts for growing the four layers. A fifth bin 644 contains melts for growing the GaAs cap layer; and a sixth empty bind 648 serves as a storage area. Referring also to the cooling diagram of FIG. 6B, the LPE reactor is allowed to be cooled continuously within the temperature range delimitated by the points 611 and 647. The range has a high temperature of 850 degrees Centigrade. As the temperature drops, the substrate 200 is pushed successively through the first four bins to grow the device layers. When the temperature has dropped to the point 645, the growth of the first four layers comprising the device layers have been completed. The substrate is then pushed through the fifth bin to grow a cap layer as the temperature drops further to a point 647.

In one embodiment of the invention, prior to the growth of the final fifth, substitute substrate layer, the wafer is stored in the sixth, empty bin 648 while the reactor is heated up to the starting high temperature. When the reactor has reached the predetermined temperature denoted by point 649, the substrate is pushed from the sixth, empty bin 648 to a seventh bin 650 containing the melt for growing the substitute substrate layer. The temperature of the reactor is further raised to a point 651, sufficient to melt back the protective GaAs cap layer, before being allowed to cool down for growing the relatively thick transparent substrate layer.

In another embodiment of the invention, prior to the growth of the final fifth, substitute substrate layer, the wafer with the capped layers is removed from the LPE reactor and transferred to another LPE reactor configured to grow the substitute substrate layer. The substrate is pushed into a bin containing the appropriate melt at high temperature and a thick layer of transparent substrate is grown as the melt cools down.

Referring again to FIG. 5, the three p-type layers 222, 224 and 226 have similar dopant concentrations, preferably in the range of $10^{16}$ or $10^{18}$ atoms per cubic centimeter. Magnesium is preferably used as the p-dopant. Tin or tellurium is favorably used as the n-dopant. The fourth n-type layer 228 preferably has a dopant concentration of mid $10^{16}$ to mid $10^{17}$ atoms per cubic centimeter, so that it is optimized for light output efficiency at the p-n heterojunction 227. The fifth, n-type substrate layer 210 preferably has a dopant concentration of $10^{17}$ to $10^{18}$ atoms per cubic centimeter.

After all the device layers including the fifth substrate layer 210 have been formed on the original GaAs substrate 200, the light absorbing substrate 200 is removed by chemical etching, leaving behind the LED device 220 on a transparent substrate 210. The chemical etching is performed with a solution such as a combination of hydrogen peroxide and sodium hydroxide or hydrogen peroxide and ammonium hydroxide.

One or more ohmic contacts 241 are then formed over the open surface of the first p-type layer 222 by conventional techniques such as evaporation. In the preferred embodiment, the contacts 241 are made of aluminum or gold-zinc or gold-beryllium alloys.

One or more ohmic contacts 251 are also formed over the remaining surface of the n-type AlGaAs substrate 210 by conventional methods such as evaporation. The ohmic contacts 251 are preferably made of gold-germanium or gold-tin alloys.

The advantage of the inverted substrate structure of the present invention is that it allows the making of very efficient transparent substrate LED's with high reliability and yield.

Another embodiment of the present invention is the use of a single heterojunction in the device 220, upon which an inverted transparent substrate is grown.

It should also be understood that in the example shown in FIG. 5 the structure can be grown in such a way that layers 222 and 224 can be n-type and layers 228 and 210 can be p-type as an alternative. Thus, the n-side up versus p-side up configurations are a matter of choice and are both within the scope of this invention.

The present invention describes an application for making visible red LEDs. However, the same invention is equally applied to deeper red (longer wavelengths) and $Al_xGa_{1-x}As$ active layer has a composition x greater than zero, but less than 0.35. For these devices the corresponding bandgaps of the materials are smaller. Thus, the compositions of the n- and p-type confining layers and transparent substrate layer have aluminum concentration layer than for the red LED described above. However they must have an aluminum concentration higher than that of the active layer so as not to absorb the radiation emitted from the active layer. Furthermore, for these longer wavelength LEDs, the active layer can be either n- or p-type.

Although the various aspects of the present invention have been described with respect to its preferred embodiments, it will be understood that the invention is to be limited only by the scope of the appended claims.

I claim:

1. An electro-optical device comprising:
   a section which converts electrical current to light or light to electrical current, said section including a semiconductor material doped with a dopant which has a diffusivity smaller than that of zinc; and
   a substrate adjacent to the section, said substrate being substantially transparent to the light to be converted or emitted by the section, said substrate and the section having been grown epitaxially from a substrate which is opaque to the light to be converted or emitted by the section, wherein the section is grown before the transparent substrate and the opaque substrate is sequently removed, the dislocation density in the section being less than the dislocation density in the transparent substrate.

2. The device of claim 1, wherein said section is a light emitting diode including a first p-type layer and a second n-type layer adjacent to each other, the band gaps of the two layers being such that the p-type layer emits light by converting electrical current to light, said p-type layer being doped with the dopant.

3. The device of claim 2, wherein said section includes a second p-type layer adjacent to the first p-type layer, said first and second p-type layers forming another heterojunction so that the device is a double heterostructure.

4. The device of claim 1, wherein said opaque substrate is composed of GaAs, and the section and transparent substrate composed of AlGaAs.

5. The device of claim 4, said device having been grown by a liquid phase epitaxial process wherein AlGaAs is epitaxially grown onto the opaque substrate to form the device, wherein the aluminum content in the substrate decreases in the growth direction.

6. The device of claim 1, wherein said dopant is magnesium.

7. The device of claim 1, wherein said opaque substrate is composed of GaAs, and the section and the transparent substrate composed of AlInGaP.

8. The device of claim 1, wherein the opaque substrate has a dislocation density less than about $10^5$/sq.cm.

9. An electro-optical device comprising:
   an epitaxially grown active section which converts electrical current to light or light to electrical current; and
   an epitaxially grown substrate adjacent to the active section, the substrate being substantially transparent to the light to be converted or emitted by the active section and having more imperfections than the active section.

10. The device of claim 9 wherein said active section is a light-emitting diode including a first p-type layer and a second n-type layer adjacent to each other, the band gaps of the two layers being such that the p-type layer emits light by converting electrical current to light.

11. The device of claim 10 wherein said section includes a second p-type layer adjacent to the first p-type layer, said first and second p-type layers forming another heterojunction so that the device is a double heterostructure.

* * * * *